United States Patent
Bartley et al.

(10) Patent No.: US 11,864,327 B2
(45) Date of Patent: Jan. 2, 2024

(54) CREATING INDUCTORS, RESISTORS, CAPACITORS AND OTHER STRUCTURES IN PRINTED CIRCUIT BOARD VIAS WITH LIGHT PIPE TECHNOLOGY

(71) Applicant: INTERNATIONAL BUSINESS MACHINES CORPORATION, Armonk, NY (US)

(72) Inventors: Gerald Bartley, Rochester, MN (US); Darryl Becker, Rochester, MN (US); Matthew Doyle, Chatfield, MN (US); Mark Jeanson, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 540 days.

(21) Appl. No.: 17/006,305

(22) Filed: Aug. 28, 2020

(65) Prior Publication Data

US 2020/0396847 A1   Dec. 17, 2020

Related U.S. Application Data

(62) Division of application No. 15/881,205, filed on Jan. 26, 2018, now Pat. No. 10,834,828.

(51) Int. Cl.
*H01F 27/28* (2006.01)
*H05K 3/30* (2006.01)
(Continued)

(52) U.S. Cl.
CPC .............. *H05K 3/301* (2013.01); *G02B 6/46* (2013.01); *G03F 7/70733* (2013.01); *H01B 1/02* (2013.01);
(Continued)

(58) Field of Classification Search
CPC ........ H05K 3/301; H05K 1/115; H05K 1/184; H05K 3/4038; H05K 3/42;
(Continued)

(56) References Cited

U.S. PATENT DOCUMENTS 3,268,652 A * 8/1966 Burns ................... H05K 3/4046
174/262
3,390,012 A * 6/1968 Haberecht ........... H01L 21/4846
148/DIG. 71
(Continued)

FOREIGN PATENT DOCUMENTS

CN   101351083 A   1/2009
CN   106163107 A   11/2016
(Continued)

OTHER PUBLICATIONS

List of IBM Patents or Patent Applications Treated as Related dated Aug. 28, 2020, 2 pages.
(Continued)

*Primary Examiner* — Steven T Sawyer
(74) *Attorney, Agent, or Firm* — Tutunjian & Bitetto, P.C.; Nathan Rau

(57) ABSTRACT

An inductor structure is provided that is positioned within a via of a printed circuit board. The inductor structure includes a via extending through a printed circuit board. The inductor structure includes at least one coil of an electrically conductive material beginning at a first opening to the via continuously present on a sidewall of the via encircling a center of the via extending to a second opening of the via opposite the first opening of the via. It further includes at least electrode present in contact with an end of the coil at said first or second opening.

11 Claims, 8 Drawing Sheets

(51) Int. Cl.
*H01F 41/04* (2006.01)
*H01F 17/00* (2006.01)
*G03F 7/00* (2006.01)
*G02B 6/46* (2006.01)
*H01B 1/02* (2006.01)
*H01F 27/06* (2006.01)
*H01G 2/06* (2006.01)
*H05K 1/11* (2006.01)
*H05K 1/18* (2006.01)
*H05K 3/40* (2006.01)
*G03F 1/62* (2012.01)

(52) U.S. Cl.
CPC ..... *H01F 17/0013* (2013.01); *H01F 17/0033* (2013.01); *H01F 27/06* (2013.01); *H01F 27/2804* (2013.01); *H01F 41/042* (2013.01); *H01F 41/046* (2013.01); *H01G 2/06* (2013.01); *H05K 1/115* (2013.01); *H05K 1/184* (2013.01); *H05K 3/4038* (2013.01); *G03F 1/62* (2013.01); *H01F 2017/002* (2013.01); *H01F 2017/004* (2013.01); *H01F 2027/065* (2013.01)

(58) Field of Classification Search
CPC ......... H05K 2201/09645; H05K 1/162; H05K 1/165; H05K 1/167; H05K 3/064; H05K 2201/086; G02B 6/46; G03F 7/70733; G03F 1/62; H01B 1/02; H01F 17/0013; H01F 17/0033; H01F 27/06; H01F 27/2804; H01F 41/042; H01F 41/046; H01F 2017/002; H01F 2017/004; H01F 2027/065; H01G 2/06; H01G 4/005; H01G 4/33; H01C 7/006; H01C 7/003; H01C 17/06513; H01C 17/065
See application file for complete search history.

(56) References Cited

U.S. PATENT DOCUMENTS

| | | | |
|---|---|---|---|
| 3,616,532 A * | 11/1971 | Beck | H01R 12/523 361/776 |
| 4,883,571 A | 11/1989 | Kondo et al. | |
| 5,037,722 A | 8/1991 | Watanuki | |
| 5,185,625 A | 2/1993 | Abe et al. | |
| 5,691,541 A | 11/1997 | Ceglio et al. | |
| 5,708,569 A | 1/1998 | Howard et al. | |
| 5,870,176 A | 2/1999 | Sweatt et al. | |
| 6,091,310 A * | 7/2000 | Utsumi | H01L 23/645 336/200 |
| 6,711,814 B2 * | 3/2004 | Barr | H05K 3/403 361/767 |
| 8,232,194 B2 | 7/2012 | Trezza | |
| 8,279,022 B2 | 10/2012 | Thom et al. | |
| 9,113,569 B2 | 8/2015 | Takenaka | |
| 2004/0149585 A1 * | 8/2004 | Wong | H01F 41/041 205/118 |
| 2005/0093672 A1 | 5/2005 | Harding | |
| 2005/0112798 A1 | 5/2005 | Bjorbell | |
| 2006/0213686 A1 | 9/2006 | Wu | |
| 2008/0105826 A1 * | 5/2008 | Mercure | H01Q 11/08 343/895 |
| 2009/0046345 A1 | 2/2009 | Hsu | |
| 2009/0079530 A1 | 3/2009 | Chandrasekhar et al. | |
| 2016/0378215 A1 * | 12/2016 | Xiao | H05K 1/116 345/173 |
| 2017/0178786 A1 * | 6/2017 | Lambert | H01F 41/0206 |
| 2017/0296319 A1 | 10/2017 | Peery | |
| 2017/0338034 A1 * | 11/2017 | Yun | H03H 7/466 |

FOREIGN PATENT DOCUMENTS

| | | |
|---|---|---|
| JP | H0267848 A | 3/1990 |
| JP | H041639 A | 4/1990 |
| JP | 316666 A | 1/1991 |
| JP | H0326717 A | 2/1991 |
| JP | H053337 A | 1/1993 |
| JP | H0516386 A | 1/1993 |
| JP | 11354326 A | 12/1999 |
| WO | 2003072967 A1 | 9/2003 |

OTHER PUBLICATIONS

Search Report Issued in 19744558.8 dated Feb. 2, 2021, 9 pages.
Decision to Grant a Patent issued in corresponding Japanese Patent Application No. 2020-538134 dated Oct. 11, 2022, 2 pgs.
International Search Report Issued in PCT/IB2019/050188 dated Apr. 24, 2019, 8 pages.

* cited by examiner

CREATING INDUCTORS, RESISTORS, CAPACITORS AND OTHER STRUCTURES IN PRINTED CIRCUIT BOARD VIAS WITH LIGHT PIPE TECHNOLOGY

BACKGROUND

Technical Field

The present disclosure generally relates to electrical devices, and more particularly to electrical devices that are integrated into the vias of printed circuit boards (PCBs).

Description of the Related Art

Printed circuit board (PCB) vias can be constructed to electrically connect different planes of the printed circuit board. There are instances where a via may need to be constructed with a spiral connection rather than the standard entire cylinder wall. Current spiral via construction requires a mechanical removal method after the via plating processes are complete. A mechanical process, also has a limit to the size of the spiral.

SUMMARY

In some embodiments, a method of creating passive electrical devices, such as inductors, resistors, capacitors, and other like passive electrical devices, in the vias of printed circuit boards (PCBs) is provided, in which processing the vias includes photo processing techniques, e.g., photolithography, coupled with the use of a light pipe. For example, the photo processing methods can be coupled with a light pipe to expose mask material to facilitate the removal of unwanted copper in the via barrel, or to provide personalization of a seed layer to allow for selective plating processes to be used. The use of the photo processing methods in combination with light pipes can eliminate some of the post car plating mechanical removal processes.

In one embodiment, the method for forming passive electrical devices, such as inductors, resistors and/or capacitors, in the via of a printed circuit board may include depositing a photo reactive layer over a sidewall of a via that extends through a printed circuit board. A light pipe having a mask configured to provide a passive electronic device geometry is positioned within the via to an entire depth of the via. Radiation provided by the light pipe exposes the photo reactive layer to provide a pattern having said passive electronic device geometry on the sidewall of the via. It is noted that in some embodiments, the light pipe is not always inserted to expose an entire depth of the via. In some embodiments, only a portion of the depth of the via may be exposed, such as in embodiments in which multiple passive electrical devices are formed vertically stacked in a single via.

In another embodiment of the present invention, an inductor structure is provided that is positioned within the via of a printed circuit board. In one embodiment, the inductor structure includes a via extending through a printed circuit board. The inductor structure includes at least one coil of an electrically conductive material beginning at a first opening to the via continuously present on a sidewall of the via encircling a center of the via extending to a second opening of the via opposite the first opening of the via. It further includes at least electrode present in contact with an end of the coil at said first or second opening.

In another embodiment of the present invention, a passive electrical device is provided that is present within a via structure of a printed circuit board, in which a tap to a center of a sidewall of the passive electrical device is embedded within the printed circuit board. In one embodiment, the passive electrical device structure includes a via extending through a printed circuit board. The passive electric device structure further includes two electrically conductive electrodes that are separated from one another and present on separate portions of the sidewall of the via, wherein at least one of the two electrically conductive electrodes extends along an entirety of the height of the via. A tap to center of a substantially center portion of a sidewall of at least one of the at least two electrically conductive electrodes is present substantially encapsulated within the printed circuit board (PCB). In one embodiment, a resistive element is present as a core of the via in electrical communication with at least two electrically conductive electrodes to provide that the passive electrical device is a resistor. In another embodiments, a node dielectric layer is present as a core of the via in electrical communication with at least two electrically conductive electrodes to provide that the passive electrical device is a capacitor.

In yet another embodiment of the present invention, a passive electrical device is provided that is present within a via structure of a printed circuit board. In the embodiment, the passive electrical device structure includes a via extending through a printed circuit board. The passive electric device structure further includes at least two electrically conductive electrodes that are separated from one another and present on separate portions of a sidewall of the via, wherein at least one of the at least two electrically conductive electrodes extends along a portion of a surface of the printed circuit board and along a part of the sidewall of the via. The embodiment also includes a resistive element that partially fills the via.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
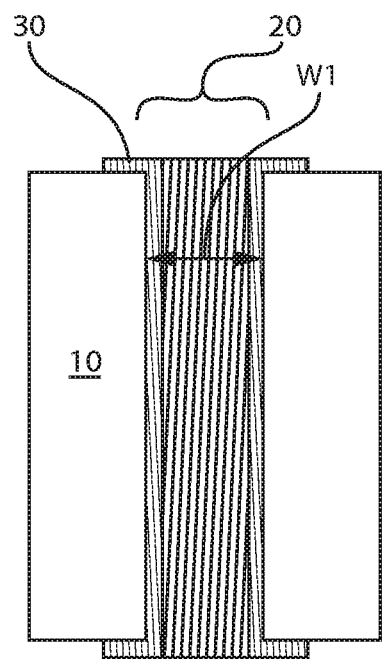
FIG. 1 is a side cross-sectional view of a via extending through a printed circuit board, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe methods and structures for producing passive electronic devices, such as inductors, resistors, capacitors. In one embodiment, a method for forming passive electrical devices is provided that includes depositing a photo reactive layer over a sidewall of a via that extends through a printed circuit board; and inserting a light pipe having a mask configured to provide a passive electronic device geometry within the via to an entire depth of the via. With the light pipe positioned within the via, the method can continue with exposing the photo reactive layer to radiation provided by the light pipe to provide a pattern having the passive electronic device geometry on the sidewall of the via. In some embodiments, an electrically conductive material is present on the sidewall of the via prior to depositing the photo reactive layer over the sidewall of the via, and exposing the photo reactive layer provides a first etch mask having passive electronic device geometry that exposes portions of the electrically conductive material that is to be removed. In some embodiments, the method further includes etching the portions of the electrically conductive material exposed by the first etch mask, wherein remaining portions of the electrically conductive material provides the conductive feature of the passive electronic device within the via.

It is noted that it is not necessary, that the electrically conductive material be present on the sidewalls of the via prior to application of the photo reactive layer. For example, in one embodiment, the process can begin with providing a via in a base material in a direction perpendicular to a plane of the base material, and applying a photoresist layer to an interior surface of the via. The via may be an opening through the base material, which can have a circular or oblong like cross section. The method may further include inserting a light pipe structure including a light guide into the via, exposing, by the light guide, a portion of the photoresist layer to light, thereby resulting in an exposed portion of the photoresist layer and an unexposed portion of the photoresist layer, removing a portion of the photoresist layer, and plating an area of the via, where the photoresist has been removed, with a metal, thereby resulting in a portion of the via plated with metal to provide the conductive features of a passive electronic device that is present within the via and a portion of the via not plated with metal.

In each of the aforementioned examples, the electrically conductive material provides the conductive feature of the passive electronic device within the via may have a geometry that provides a spiral type geometry, e.g., spiral coil, for an inductor. In some embodiments, the center of the via may include an electrically conductive core, such as a ferromagnetic metal core. In some embodiments, the inductor includes two spirals that are etched at 180 degrees from each other's starting point to form a transformer or choke. In other embodiments, the plated portions that remain may be further processed to provide a resistor and/or a capacitor. Further details for the methods and structures of the present disclosure are now described with reference to FIGS. 1-18.

FIG. 1 depicts one embodiment of a via 20 extending through a printed circuit board 10. For example, the printed circuit board 10 may be a multi-layer printed circuit board (PCB) that is a stack of PCB layers. In some examples, electrical components may be present on each of the PCB layers. One method of connecting the layers of the PCB layers is by forming vias (or holes) through one or more of the PCB layers and coating or depositing metal on the inner surface of the via. Metal coated vias are used in multi-layered printed circuit boards to electrically connect conductive lines or traces in differing layers of the printed circuit boards.

In some embodiments, the printed circuit boards (PCB) 10 may include a substrate of a dielectric material. For example, the circuit board may be composed of fiber-reinforced plastic (FRP) (also called fiber-reinforced polymer, or fiber-reinforced plastic) is a composite material made of a polymer matrix reinforced with fibers. The fibers are usually glass, carbon, aramid, or basalt. The polymer is usually an epoxy, vinylester, or polyester thermosetting plastic, though phenol formaldehyde resins are still in use. In some embodiments, the printed circuit board (PCB) is composed of a composite consistent with the above description that is called FR-4.

During the manufacturing of the printed circuit board 10, the vias 20 may be created by plating drilled vias in the board with a conductive material (e.g., copper). Typically, the entire depth of the via may be plated with the copper material. In this context, a stub refers to a portion of the via extending beyond the desired signal layer escape, and hence not part of the main-line signal path.

In order to reduce the impact of stubs on circuit board performance, the stubs may be removed from the board, or at least shortened, during the manufacturing process. One method for removing stubs is called back drilling. In this process, a drill bit, commonly one which has a slightly larger diameter than the bit used in predrilling the hole for the via (prior to plating), may be used by a drill for boring into the via and removing the plating material from its stub portion.

In an embodiment, a multilayer PCB 10 is formed with a via 20 (e.g., through hole) through two or more layers of the PCB. In an embodiment, the via is formed by drilling or punching a hole through the PCB after the multilayer PCB is stacked. In an embodiment, the via is formed by aligning individual holes in in the PCB layers to form a single via. In an embodiment, the via runs through the full thickness of the PCB. For example, a via could be drilled through each of the layers after the PCB is formed. In an embodiment, the via runs through some of the layers but not all of the layers of the PCB. For example, vias could be punched through a portion of the layers of the PCB and those portions could be aligned during assembly of the multilayer PCB. In an embodiment, the PCB has multiple through holes or vias similar to the aforementioned vias.

The width W1 of the via 20 may be of a microscale. The term "microscale" denotes a dimension of 1 micron or less. For example, the width W1 of the via 20 may range from 100 nm to 1 micron. In another example, the width W1 of the via 20 may range 200 nm to 800 nm. It is noted that the aforementioned examples for the width W1 of the via 20 are provided for illustrative purposes only, and are not intended to be limiting. For example, in other embodiments, the width W1 of the via 20 may be equal to 100 nm, 200 nm, 300 nm, 400 nm, 500 nm, 600 nm, 700 nm, 800 nm, 900 nm, and 1 micron, as well as any range of values including one of the aforementioned examples as a lower limit of the range and one of the aforementioned examples as an upper limit of the range.

When viewed from a top to down view, the via 20 may have a shape that provides an arcular geometry, i.e, a geometry that includes at least one arc. For example, when viewed from a top to down view, the via may have a shape having a circular and/or oblong geometry.

Still referring to FIG. 1, in some embodiments, following the formation of the via 20 through the PCB 10, an electrically conductive material 30 may be deposited on the sidewalls of the via 20. In some example, the electrically conductive material may be copper, which can be deposited by plating of electroless copper. Prior to the actual plating of electroless copper, some pretreatment of the surface to be plated may include cleaning, conditioning, etching and activation. It is noted that other steps not specifically recited may also be conducted prior to plating in order to prepare the surface of the deposition of the plated copper.

Cleaning may include the application of a cleaner that can be alkaline in nature, although neutral or acidic materials may also suffice. The purpose of the cleaning step can be to remove soil, oils, impact drill debris and combinations thereof. Conditioning may include wetting the surface with a uniformity of polarity that may be provided by at least one surfactant. Etching, i.e., micro-etching, can include the formation of a micro toothed structure on the dielectric surfaces on which the electroless copper is to be deposited. Micro-etching may include application of chemistries, such as ammonium persulfate, sodium persulfate, other sulfuro-oxide type etchants, and combinations thereof. Activation includes the providing an seed layer on the sidewalls of the via 20, on which the electroless copper may be plated. The activating species, which provides the seed layer, can be held primarily mechanically to both the copper surface of the plated material and the dielectric surface of the sidewall of the via 20. Activating solutions (or catalysts) can contain palladium held in a reduced state by stannous ions. These solutions are typically high in chloride ion and possess some degree of acidity. The activating solution may be applied to the copper deposition surface by wet chemical application.

Following the activation of the sidewall of the via 20, i.e, the formation of the seed layer, the electrically conducive material layer 30, i.e., copper layer, may be plated onto the sidewall of the via 20. The electrically conductive material layer 30 may be plated from an electroless copper bath formulation that can include copper salts, reducing agent (formaldehyde), alkaline hydroxide, chelating agents (quadrol, EDTA, Rochelle salts, etc.), stabilizers, brighteners, wetting agents (optional) and combinations thereof. In some embodiments, the formaldehyde and the hydroxide ions provide the reducing force for the deposition of metallic copper. In one embodiment, the main plating reaction can be postulated to be:

$$Cu(II)(chel) + 2HCHO + 4OH^- \rightarrow Cu^0 + 2HCOO^- + (chel)^= + 2H_2O + H_2$$

In some embodiments, the electroless copper bath may be drawn into the vias 20 with the application of pressure and/or vacuum. In some embodiments, the electroless copper bath may deposit the electrically conductive material 30 on an entirety of a sidewall of the via 20.

It is noted that the use of electroless deposition is only one example for forming the electrically conductive material. The present disclosure is not limited to only this example. For example, the electrically conductive material 30 may also be deposited using physical vapor deposition methods, such as sputtering; chemical vapor deposition methods, such as plasma enhanced chemical vapor deposition (PECVD); atomic layer deposition (ALD) and combinations thereof. Further, the composition of the electrically conductive material 30 is not limited to only copper. For example, the composition of the electrically conductive material 30 may also be composed of aluminum (Al), tungsten (W), tantalum (Ta), silver (Ag), gold (Au), platinum (Pt) and combinations thereof including combinations with copper (Cu).

Figure 2:
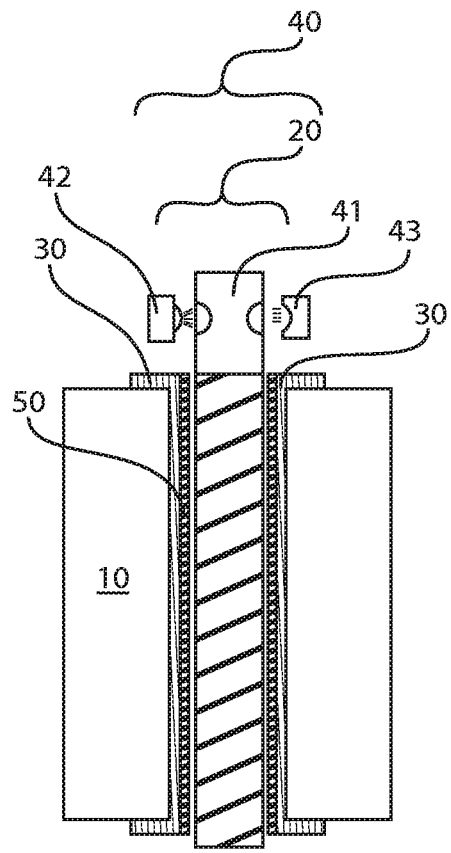
FIG. 2 is a side cross-sectional view of a photo reactive material, e.g., photoresist, being positioned on the sidewalls of the via, and inserting a light pipe having a mask for a geometry of a pattern to be transferred to the layer of the photo reactive material, in accordance with one embodiment of the present disclosure.

FIG. 2 depicts one embodiment of a photo reactive material 35, e.g., photoresist, being positioned on the sidewalls of the via 20, and inserting a light pipe 40 having a mask for a geometry of a pattern to be transferred to the layer of the photo reactive material 35. The photo reactive material 35 may be deposited directly on the electrically conductive material layer 30.

The photo reactive material 35 may be a photoresist. In an embodiment, the photo resin is a positive photoresist. In a positive photoresist resin, the portion of the photoresist that is exposed to light becomes soluble to a photoresist developer, while the unexposed portion of the photoresist resin remain insoluble to the photoresist developer. In another embodiment, the photoresist resin is a negative photoresist resin. In a negative photoresist resin, the portion of the photoresist that is exposed to light becomes insoluble to the photoresist developer while the unexposed portion of the photoresist is dissolved by the photoresist developer. In an embodiment, the photoresist is a photopolymeric photoresist. For example, the photoresist could be methyl methacrylate. In an embodiment, the photoresist is a photodecompostable photoresist. For example, the photoresist could be diazonaphtaquinone. In an embodiment, the photoresist is a photo crosslinking photoresist. In an embodiment, the photoresist is a self-assembled monolayer photoresist. In an embodiment, air is blown into the via after coating with the photoresist to prevent tenting. Tenting is a meniscus layer of the photoresist resin on the surface of the via.

The light pipe structure 40 may include a light guide 41. The light guide 41 may receive light from a primate light source, which is not depicted, but is present at the opposite end of the light guide 41 from the portion of the light guide that provides the pattern exposure. The light guide 41 is capable of transmitting light, i.e., exposure radiation for patterning the photo reactive layer 35, from the light source. The light source can be any light source capable of introducing light (e.g., visible, ultraviolet, infrared, etc.) into the light guide 41 for transmission to the intended surfaces. In some embodiments, an alignment light source 42 and a light detector 43 may be present on opposing sides of the light guide 41.

In an embodiment, the light guide 41 of the portion of the light pipe structure 40 is inserted into the via 20. The light guide 41 is capable of transmitting light from a light source and exposing a portion of the via 20 with the light from the light source. In an embodiment, the light guide 41 could be any optical cable or projecting member that is capable of transmitting light. The light guide 41 may be composed of a glass material or a polymeric material with high light transmittance. The light guide 41 typically has a geometry that fits within the via 20. Generally, the light guide 41 has a geometry that corresponds to the geometry of the sidewall of the via 20. For example, when viewed from a top down view the perimeter of the via 20 is substantially circular, the light guide 41 when viewed from a top down view also has a perimeter that is substantially circular, in which the diameter of the light guide 41 is less than the diameter of the opening of the via 20 so that the light guide 41 may fit within the via 20.

In an embodiment, the light guide 41 has light dispersion characteristics such that light will come out of the sidewall of the light guide 41. The light guide 41 can be designed such that light will come out of the sidewalls and/or the end of the light guide 41. In one example, the light guide 41 can be designed such that the light has a multi-mode dispersion at the sidewalls. In an embodiment, the end of the light guide is cleft or cut off, such that the light is dispersed towards the sidewalls of the via it is inserted into. For example, the light guide could be cut off straight or rounded with multiple cutes. In an embodiment, the light guide 41 is tuned to optimize the light guides transmission of the light. For example, stress or strain can be induced in the light guide 41 to change the optical properties of the light guide 41.

In an embodiment, a portion of an outer surface of the light guide 41 is masked, i.e., has a mask 50 present thereon. In an embodiment, the mask 41 is designed to prevent light from exiting the light guide 41 in the portion of the light guide 41, where the outer surface is covered by the mask 50. In an embodiment, the mask 50 is designed to reflect or refract light back in towards the light guide 41 in the portion of the light guide 41 where the outer surface covered is by the mask 50. In an embodiment, the masked portion of the light guide 41 has two or more masked regions separated by one or more unmasked regions. In an embodiment, the mask 50 is a coating on the surface of the light guide. In an embodiment, the light guide 41 would be masked by a surface treatment that is reflective of the wave length of light that is being used in the photo resistive process. For example, silver nitrate could be used. In an embodiment, the mask 50 absorbs light. For example, an optical black coating could be used to absorb light. In an embodiment, any portion of the light guide 41 that is not masked will have an optical coating. An optical coating is a coating that affects the way light is transmitted/dispersed out of or reflected/refracted back into the light guide 41. In another example, the mask 50 could be an etching of the surface of the light guide 41. The mask 50 could also combine an etching with a coating. In an embodiment, the unmasked region is etched to affect light dissemination to the surface of the via. In an example, the light guide is a transparent core surrounded by a transparent cladding material with a lower index of refraction where the transparent cladding material with a lower index of refraction is the mask. In an embodiment, the transparent cladding only partially covers the surface of the light guide 41.

The mask 50 includes openings that provide the covered and uncovered portions of the light guide 41 having a geometry corresponding to the geometries desired for the electrically conductive features of the passive electronic devices being formed, e.g., inductors, resistors and/or capacitors.

Figure 3:
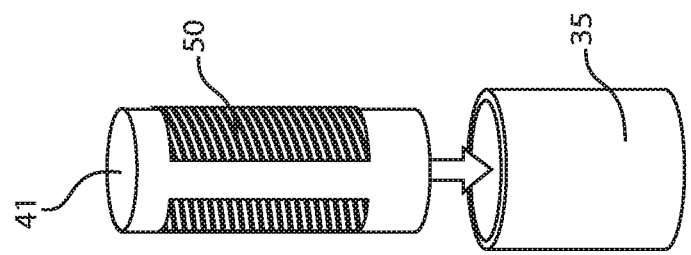
FIG. 3 is a perspective view of another embodiment of a mask applied to a light pipe for a coil structure within a via, in which the portion of the light pipe that is positioned within the via, and extends along the entire height of the via, has the pattern of a coil structure for forming an inductor within the via.

FIG. 3 depicts one embodiment of a mask 50 applied to a light pipe structure 40, i.e., applied to the light guide 41, for forming a coil structure within a via 20. More specifically, the mask 50 has a pattern through which light is passed that is being communicated from the light source through the light guide 41, through the openings in the mask 50 to the photo reactive layer 30, in which the pattern is in the geometry of a coil. The coil geometry may be a length of material that is would in a spiral or sequence of rings that are joined in sequence to be continuous. In some embodiments, the openings in the mask 50 may be angled relative to the upper surface of the PCB 10 through which the via 20 extends to provide that the coil begins at an upper surface of the PCB 10, i.e., at a first opening to the via 20, extends through the via 20 with sequential angled coils, and ends at a bottom surface of the PCB 10, i.e., at a second opening to the via 20. The mask 50 depicted in FIG. 3 is present on the portion of the light guide 41 that is positioned within the via 20, and extends along the entire height of the via 20. The pattern of the coil structure provided by the mask 50 depicted in FIG. 3 may be employed for forming an inductor within the via 20. The inductor may include a transformer and/or a choke.

Figure 4:
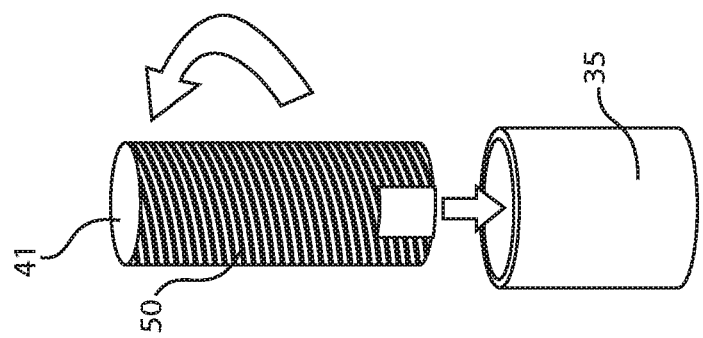
FIG. 4 is a perspective view of one embodiment of a mask applied to a light pipe for forming a coil structure within a via, in which the light pipe is rotated while being inserted within a via during an exposure step.

FIG. 4 depicts another embodiment of a mask 50 applied to a light pipe structure 40, i.e., applied to the light guide 41, for forming a coil structure within a via 20. In the embodiment that is depicted in FIG. 4 the mask 50 covers the majority of the light guide 41. In this example, there may be only one opening in the mask 50, in which to provide a coil geometry, the light guide having the mask 05 depicted in FIG. 4 is rotated while being inserted within the via 20 during an exposure step. More specifically, light guide 41 is rotated, therefore rotating the opening in the mask 50 through which exposure radiation is being passed in order to expose the photo reactive layer 35. To provide that the coil geometry extends through the via 20, a light guide 41 having the mask 50 depicted in FIG. 4 would be traversed through the via 20 simultaneously with the rotation of the light guide 41 and the application of the light by the light source to the light guide. The pattern of the coil structure provided by the mask 50 depicted in FIG. 4 may be employed for forming an inductor within the via 20. The inductor may include a transformer and/or a choke.

Figure 5:
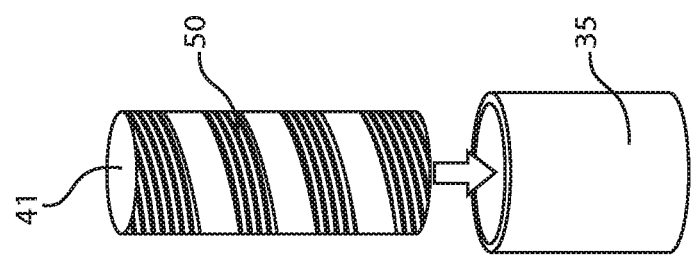
FIG. 5 is a perspective view of another embodiment of masking applied to a light pipe, in which the geometry of the masking may provide a pattern for electrodes to a passive electrical device, such as a capacitor and/or resistor.

It is noted that coil structures are not the only structures that may be patterned by masks being applied to the light guide 41 of the light pipe structure. For example, electrodes for capacitors and/or resistors and/or other like passive electrical devices may be patterned by a masked light pipe structure, in accordance with the methods and structures described herein. FIG. 5 depicts another embodiment of masking applied to a light guide 41, in which the geometry of the mask 50 may provide a pattern for electrodes to a passive electrical device, such as a capacitor and/or resistor.

Figure 6:
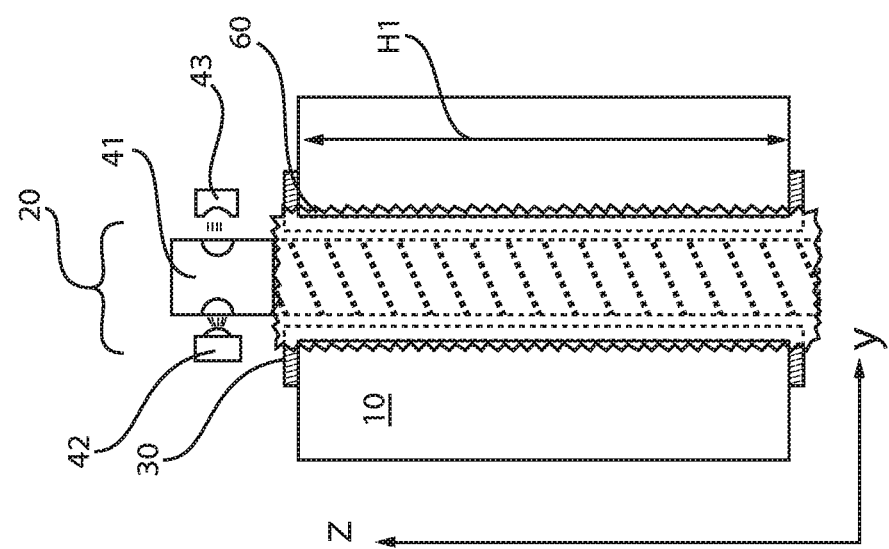
FIG. 6 is a side cross-sectional view depicting applying radiation through the opening in the masking that is present on the light tube to expose the photo reactive material that is present within the via with the pattern of the mask, in accordance with one embodiment of the present disclosure.

FIG. 6 depicts applying radiation 60, i.e., light, through the opening in the mask 50 that is present on the light guide 41 of the light tube structure 40 to expose the photo reactive material 35 that is present within the via 20 with the pattern of the mask 50. In some embodiments, a portion of the light guide 41 is designed such that it may be inserted into a via of a printed circuit board so that patterned portion of the light guide 41 extends along an entire height H1 of the via 20. In the embodiment that is depicted in FIG. 6, the light guide 41 is masked with a pattern of the mask 50 depicted in FIG. 3. In this example, the light guide 41 is positioned within the entire depth of the via 20, but the light guide 41 is not rotated.

Because the mask 50, which may include patterned portions for the electrically conductive features of the passive electronic devices to be formed in the via 20, is present on the portion of the light guide 41 that extends along an entire sidewall of the via 20, i.e., from a first opening of the via 20 on a first side of the PCB 10 to a second opening of the via 20 on the second side of the PCB 10; and the mask 50, which may include patterned portions for the electrically conductive features of the passive electronic devices to be formed in the via 20, is present around an entire perimeter of the light guide 41, radiation exposure, i.e., light exposure, to the photo reactive material, e.g., photoresist, within the via 20 may simultaneously occur in the directions of the X-axis, Y-axis, and Z-axis. The Z-axis is parallel with the length for the height dimension H1 of the via 20. The Y-axis is perpendicular to the Z-axis and is parallel with the length for the width dimension W1 of the via 20. X-axis is perpendicular to both the Z-axis and the Y-axis, and is in a direction traveling in and out of the page, as depicted in FIG. 6.

Figure 7:
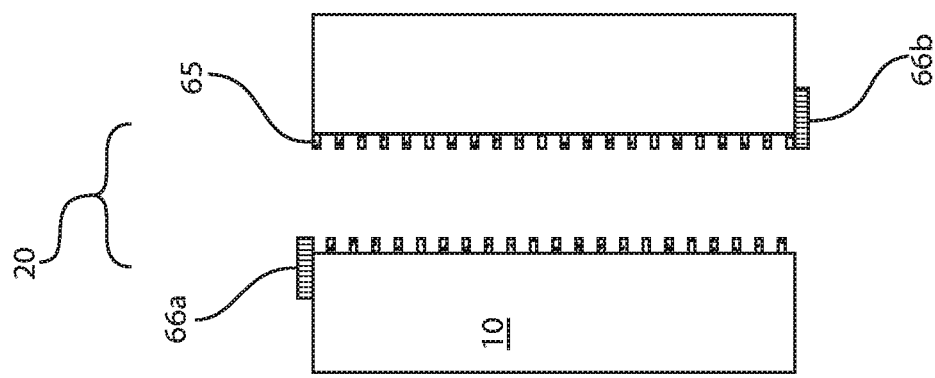
FIG. 7 is a side cross-sectional view depicting removing the light tube from the structure depicted in FIG. 6, and using a wet etchant to remove portions of a conductive layer that is present on the sidewalls of the vias and exposed by the patterned photo reactive material, in accordance with one embodiment of the present disclosure.

FIG. 7 depicts removing the light guide 41 of the light tube structure 40 from the structure depicted in FIG. 6, and using a wet etchant to remove portions of the electrically conductive layer 30 that is present on the sidewalls of the vias 29 and exposed by the patterned photo reactive material 35. In an embodiment, the photo reactive layer 35 is a positive tone photoresist material. In a positive tone photoresist material, the exposed portion of the photoresist layer is removed using a developer, e.g., chemical developer. In another embodiment, the photo reactive layer 35 is a negative tone photoresist material, and the exposed portion of the photoresist layer remains, while the portion of the photoresist layer that is not exposed to the radiation is removed using a developer, e.g., chemical developer. In an embodiment, the removing includes washing the via with a photoresist developer. In an embodiment, a photoresist developer is a liquid that dissolves uncured resin in a negative tone photoresist. In an embodiment, a photoresist developer is a liquid that dissolves cured resin in a positive tone photoresist.

Still referring to FIG. 7, following development of the exposed photo reactive layer 35, the remaining portions of the developed photo reactive layer 35 provides an etch mask that protects the portions of the electrically conductive material layer 30 that remain to provide the electrically conductive features of the passive electrical device that is containing within the via 20, while the portions of the electrically conductive material layer 30 that are exposed by the etch mask are removed using an etch process. In some embodiments, the etch process may include a wet chemical etch process. The etch chemistry for removing the exposed portions of the electrically conductive material layer may be selective to the sidewall of the via 20. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. It is noted that wet chemical etching is not the only etch method that may be used at this step of the process flow. For example, dry etch processes, such as plasma etching, gas etching, and/or reactive ion etching (RIE) may also be used at this stage of the process flow.

The etch mask, i.e., developed and patterned photo reactive layer 35, e.g., photoresist mask, may be removed following etching the of the electrically conductive material layer 30. The etch mask may be removed using chemical stripping, etching, oxygen ashing or a combination thereof.

Following removal of the exposed portions of the electrically conductive material layer 30 by the etch process, the portions of the electrically conductive material layer 30 that remain provide an electrically conductive feature 65 of the passive electrical device that is formed within the via 20. In the embodiment that is depicted in FIG. 7, in which the light guide 41 is masked with a mask 50 having the geometry that is described with reference to FIG. 3, the electrically conductive feature 65 may have the geometry of a coil, which can provide the electrically conductive feature 65 of a passive electrical device that is an inductor.

An "inductor", also called a coil, choke or reactor, is a passive two-terminal electrical component that stores electrical energy in a magnetic field when electric current flows through it. An inductor may include of an insulated electrical pathway that is wound into a coil around a core. When the current flowing through an inductor changes, the time-varying magnetic field induces a voltage in the conductor, described by Faraday's law of induction. According to Lenz's law, the direction of induced electromotive force (e.m.f.) opposes the change in current that created it. As a result, inductors oppose any changes in current through them. An inductor is characterized by its inductance, which is the ratio of the voltage to the rate of change of current. In some embodiments, the inductor has a magnetic core made of iron or ferrite inside the coil, which serves to increase the magnetic field and thus the inductance.

In some embodiments, contacts 66a, 66b may be formed on the surface of the PCB 10 at each opening of the via 20, in which each of the electrodes are in electrical communication with the electrically conductive feature 65 of the passive electrical device. In the embodiment depicted in FIG. 7, the electrically conductive feature 65 is a coil, e.g., copper coil, and the contacts 66a, 66b can be in direct contact with each end of the coil. The contacts 66a, 66b may be composed of any metal, such as copper. The above noted compositions for the electrically conductive material layer 35 can provide some examples of metal composition of the contacts 66a, 66b. The contacts 66a, 66b may be formed using deposition methods, such as plating, physical vapor deposition (PVD), chemical vapor deposition (CVD) and/or atomic layer deposition (ALD), in combination with a subtractive method, such as etching, laser ablation, and combinations thereof.

Figure 8:
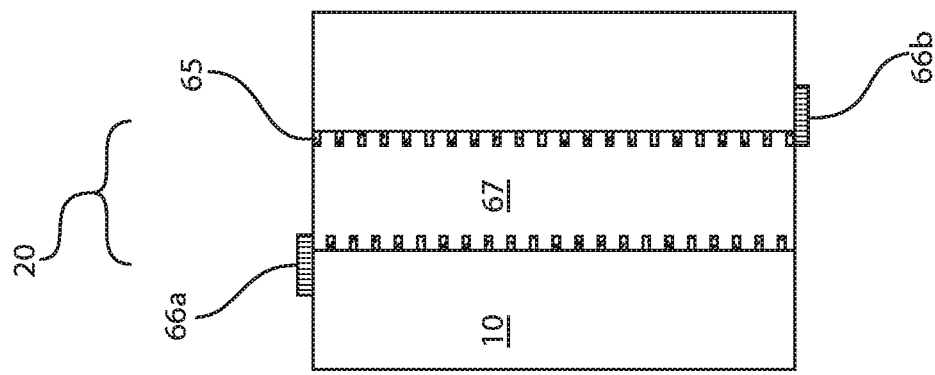
FIG. 8 is a side cross-sectional view depicting one embodiment of depositing a filler material within the via of the structure depicted in FIG. 7.

FIG. 8 depicts one embodiment of depositing a filler material 67 within the via of the structure depicted in FIG. 7. The filler material 67 can be a dielectric material. For example, the non-conductive epoxy that can be deposited into the via 20 using injection, chemical solution deposition and/or spin on deposition, as well as other deposition methods. The epoxy may be a polymeric composition. It is noted that the step of depositing the filler material 67 may be omitted.

Figure 9:
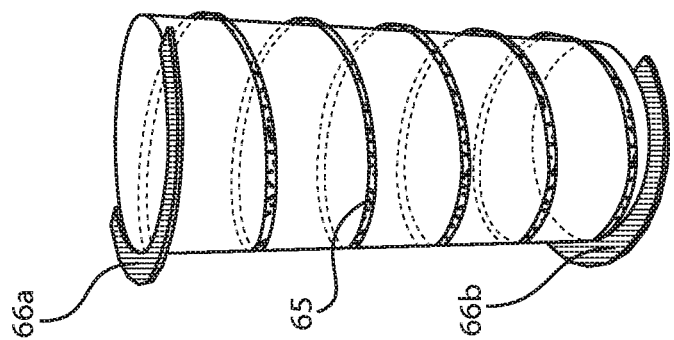
FIG. 9 is a perspective view of one embodiment of a spiral structure of an electrically conductive material for use an inductor positioned within a via structure, as depicted in FIGS. 7 and 8.

As noted above, the electrically conductive feature 65 may have a geometry that is patterned using a mask 50, as depicted in FIG. 3, that produces a coil like geometry, that can be suitable for inductors. FIG. 9 is a perspective view of one embodiment of a spiral structure of an electrically conductive material 65 for use an inductor positioned within a via structure 20, as depicted in FIGS. 7 and 8. The spiral structure depicted in FIG. 9 can be formed using a light guide 41 of a light tube structure 40 that is passed through a via 20 using a single pass.

Figure 10:
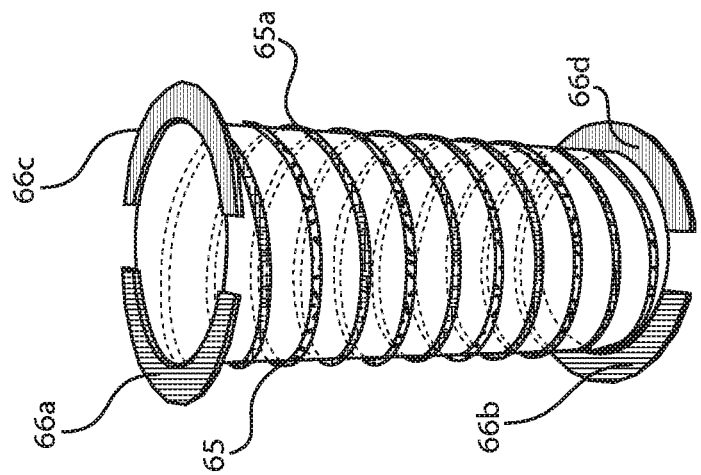
FIG. 10 is a perspective view of two spiral structures that can be used for the eclectically conductive material of an inductor that is positioned within a via structure, as depicted in FIGS. 7 and 8, in which the two spirals are etched 180 degrees from each others starting point to form a transformer or choke, in accordance with one embodiment of the present disclosure.

FIG. 10 is a perspective view of two spiral structures 65, 65a that can be used for the electrically conductive material, i.e., coils, of an inductor that is positioned within a via structure, as depicted in FIGS. 7 and 8, in which the two spirals 65, 65a are etched 180 degrees from each other's starting point to form a transformer or choke. Referring to FIG. 10, the two spiral structures 65, 65a can be formed using a light guide 41 of a light tube structure 40 that is passed through a via using a single pass, in which the two spirals are etched perpendicular to each other to form a passive electrical device of an in phase transformer or choke. Each of the two spirals includes a set of contacts 66a, 66b, 66c, 66d, as depicted in FIG. 10.

Figure 11:
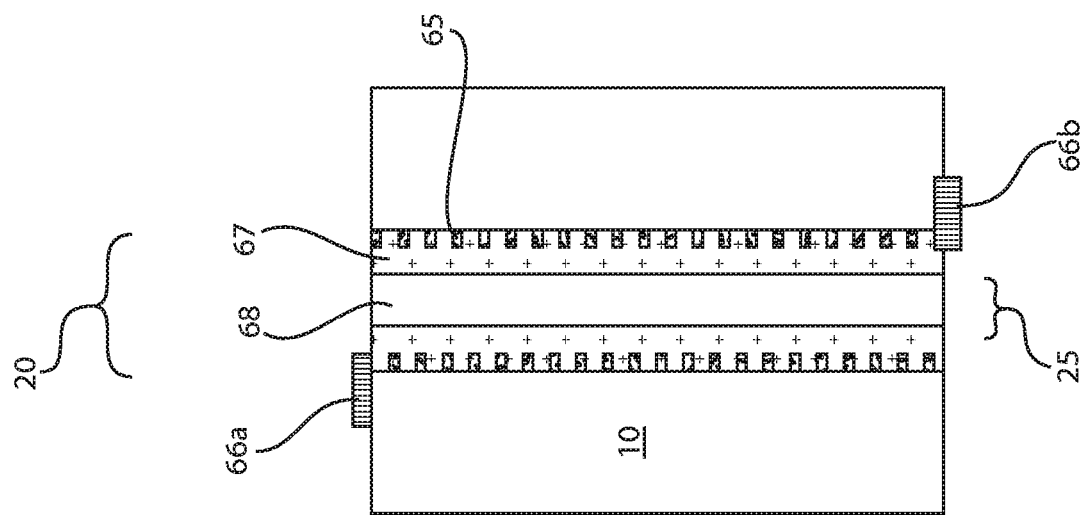
FIG. 11 is a side cross-sectional view depicting one embodiment of a forming a ferrous core within the via that is depicted in FIG. 8, in accordance with one embodiment of the present disclosure.

FIG. 11 depicts one embodiment of a forming a ferrous core 68 (also referred to as ferrite core 68) within the via that is depicted in FIG. 8. A ferrite core 68 is a type of magnetic core made of ferrite on which the windings of electric transformers and other wound components, such as inductors are formed. More specifically, in the embodiment that is depicted in FIG. 11, the windings of the coils provided by the electrically conductive features 65 are present encircling the ferrous core 68. In some examples, ferrites, as employed in the ferrous core 68, are ceramic compounds of the transition metals with oxygen, which are ferrimagnetic but nonconductive. Ferrites that are used in transformer or electromagnetic cores contain iron oxides combined with nickel, zinc, and/or manganese compounds. Some examples of ferrite compositions for the ferrous core 68 may include manganese-zinc ferrite (MnZn, with the formula $Mn_aZn_{(1-a)}Fe_2O_4$) and Nickel-zinc ferrite (NiZn, with the formula $Ni_aZn_{(1-a)}Fe_2O_4$).

In some embodiments, forming the ferrous core 68 may include forming an opening 25 in the first dielectric fill, i.e., filler material 67. The opening 25 that is formed for housing the ferrous core 68 may have a geometry that is similar to the via 20. In this example, the larger via 20 may be referred to the first via, and the opening 25 having the lesser diameter than the first via may be referred to as the second via. The opening 25 may be formed in the filler material 67 mechanically. For example, the opening 25 may be formed using a drilling method similar to the methods for forming the via 20. In other embodiments, the opening 25 may be formed by drilling with a laser, such as a UV laser and/or $CO_2$ laser.

After the opening 25 is formed through the filler material 67, the ferrous material of the ferrous core 68 may be deposited filling the opening 25 using plating, e.g., electroless plating and/or electroplating; physical vapor deposition (PVD), such as sputtering; chemical vapor deposition, such as plasma enhanced chemical vapor deposition (PECVD); and combinations thereof. It is noted that the formation of the ferrous core 68 is an optional step, and may be omitted.

Figure 12:
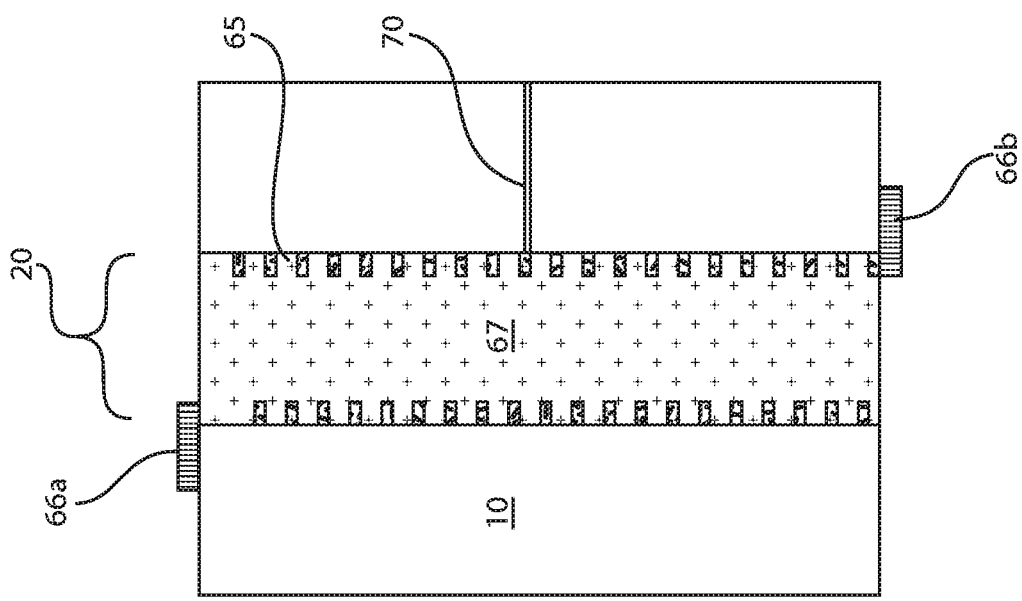
FIG. 12 is a side cross-sectional view depicting one embodiment of a tap net connection to the coil of an inductor, as depicted in FIGS. 7 and 8.

FIG. 12 depicts one embodiment of a tap net connection 70 to the coil of an inductor, as depicted in FIG. 8. The tap net connection 70 can be an embedded electrically conducive pathway, as a metal line and/or wire, that is present within the printed circuit board (PCB) 10. For example, the tap net connection 70 may be positioned between two layers of the printed circuit board (PCB) 10. The tap net connection 70 may extend from being in contact with an electrically conductive features 65, e.g., coil, that is present on sidewall of via 20 to an integrated circuit, which may be remotely positioned from the passive electrical device contained within the via 20. The tap net connection 70 may be an element of a T-coil circuit. It is noted that the presence of the tap net connection 70 is optional, and may be omitted. Further, although FIG. 12 depicts a tap net connection 70 being formed to the structure depicted in FIG. 8, the tap net connection 70 may be equally formed in electrical communication with any of the passive electrical devices that are formed within a via, in accordance with the methods described herein. For example, a tap net connection 70 may also be formed in electrical communication of the electrically conductive features 65 of the passive electrical devices depicted in FIGS. 7 and 11.

It is also noted, that although the structures depicted in FIGS. 2-12 have been described as being formed using a light guide 41 of the light pipe structure 40 having the mask 50 described with reference to FIG. 3, the mask that is depicted in FIG. 4 may be equally applicable to the process sequence and structures that have been described with reference to FIGS. 2-12.

Figure 13:
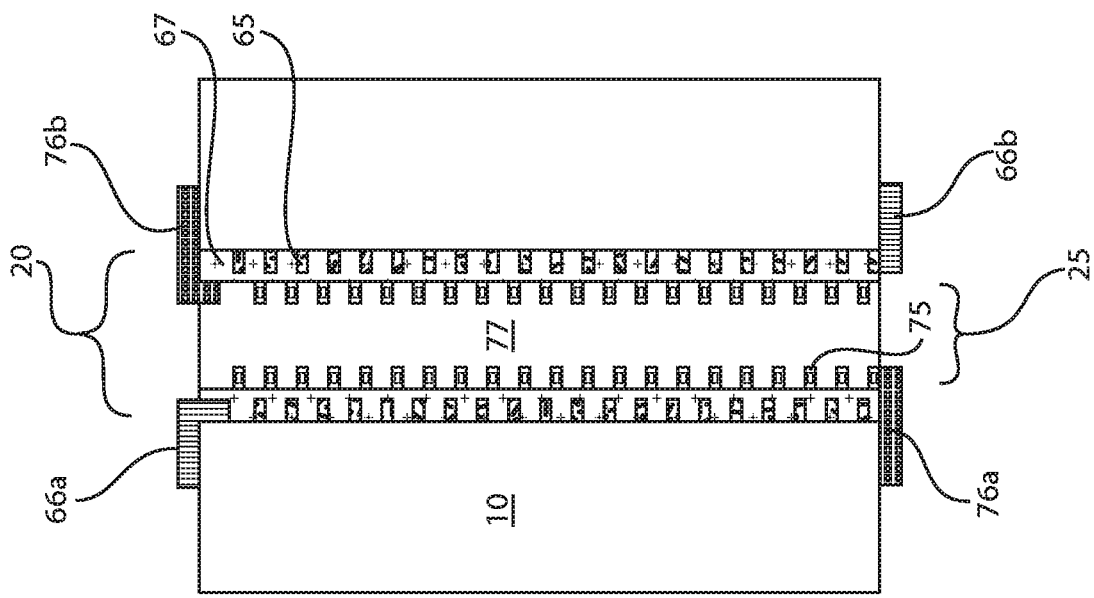
FIG. 13 is a side cross-sectional view depicting a process sequence of drilling a second via in the structure depicted in FIG. 8, depositing a layer of electrically conductive material for a second coil on the sidewalls of the dielectric material through which the second via extends, and performing a second application of a light tube patterned to provide a second coil of an inductor, in accordance with an embodiment of the present disclosure.

FIG. 13 depicts another embodiment of the present disclosure, in which multiple layers of electrically conductive features 65, 75 for a passive electrical devices may be present within a via 20. FIG. 13 depicts one embodiment of the resultant structure of a process sequence of drilling a second via 25 (also referred to as an opening) in the dielectric fill 68 of the structure depicted in FIG. 8, depositing a layer of electrically conductive material for a second coil, i.e., second set of electrically conductive features 75, on the sidewalls of the dielectric fill 68 through which the second via extends 25, and performing a second application of a light guide 41 of a light pipe structure 40, in which a mask 50 that is present on the light guide 41 is patterned to provide a second coil of an inductor. The formation of the second via 25 has been described above with reference to FIG. 11. The electrically conductive material for the second coil, i.e., second set of electrically conductive features 75, may be a metal that is similar to the electrically conductive features 65 for the first coil that is described above with reference to FIGS. 1-8. Therefore, the description of the composition and the method for forming the metal for the electrically conductive features 65 is suitable for the metal the provides the second set of electrically conductive features 75 that are depicted in FIG. 13.

Following the deposition of the metal for the electrically conductive features 75, a photo reactive material layer (not shown) may be formed on the metal layer for the electrically conductive features 75. The photo reactive material layer may be a photoresist similar to the photo reactive material layer 35 that has been described above with reference to FIG. 2.

Following the deposition of the photo reactive material layer, the method for forming the structure depicted in FIG. 13 may continue with inserting a masked light pipe structure within the opening, the masked light pipe exposing the photoresist layer to a radiation that patterns the photoresist mask to a second etch mask having a geometry of a second coil geometry; and etching the portions of the electrically conductive layer exposed by the second etch mask, wherein remaining portions of the electrically conductive layer provides the second coil structure, i.e., electrically conductive features 75, of the passive electronic device within the via 20. It is noted that the masked light pipe structure employed at this step to produce the structure depicted in FIG. 13 is similar to the light pipe structure 40 including the light guide 41 and masking 50 that has been described above with reference to FIGS. 2-5. The etch step that is described in FIG. 13 for forming the electrically conductive features 75 is similar to the etch step for forming the electrically conductive features 65 that has been described with reference to FIG. 7. In essence, the structure depicted in FIG. 13 may be a dual exposure and etch process, in which the method that has been described in FIGS. 1-8 is being repeated. In some embodiments, by repeating the process to create a second spiral "Coil" within the first spiral "coil" creates a transformer or choke. This structure is created by drilling out the non-conducting fill material from the initial process. Then the same process can be followed to form the next level of spiral. If the design requires a single inductor with many wraps or turns the process is repeated many times with each iteration connected together to form a tight large inductor within the PCB.

The second coil depicted in FIG. 13 further includes contacts 76a, 76b that are in electrical communication with the electrically conductive features 75 present within the via. The contacts 76a, 76b are present at opposing openings to the via that contain the electrically conductive features 75, and the contacts 76a, 76b are present in direct contact with the opposing ends of the coil geometry that provides the electrically conductive features 75. The contacts 76a, 76b that are depicted in FIG. 13 are similar in composition and method of formation as the contacts 66a, 66b that have been described above with reference to FIG. 7.

Figure 14:
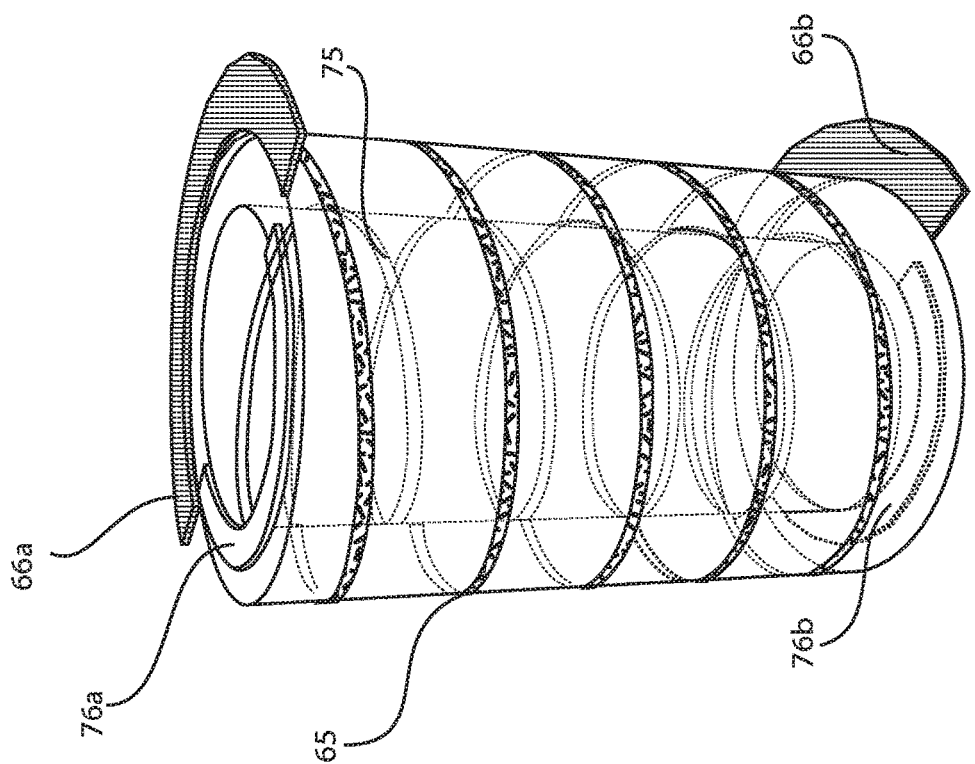
FIG. 14 is a side cross-sectional view depicting two spiral structures that can be used for the electrically conductive material of inductors contained within the via of a printed circuit board, in which the two spiral are etched 180 degrees from each other starting point to form a transformer or choke type passive device, in accordance with one embodiment of the present disclosure.

FIG. 14 depicts two spiral structures that can be used for the electrically conductive material of inductors contained within the via 20 of a printed circuit board 10, in which the two spiral are etched 180 degrees from each other starting point to form a transformer or choke type passive electrical device. The structure depicted in FIG. 14 may be formed using the method described with reference to FIG. 13. The first coil includes the electrically conductive features 65, and contacts 66a, 66b that have been described with reference to FIG. 7. This structure is formed using the first exposure applied by the light pipe structure 40. The second coil includes the electrically conductive features 75 formed using the second exposure applied by the light pipe structure that is described with reference to FIG. 13. The second coil includes contacts 76a, 76b that are in electrical communication with the electrically conductive features 75 present within the via. FIG. 14 illustrates an X-ray view of two spirals etched 180 degrees from each other's starting point to form a transformer or choke. In some embodiments, the filler between the two coils can be filled with a ferrous containing composition that has been doped to tune the interaction between the two coils.

Figure 15:
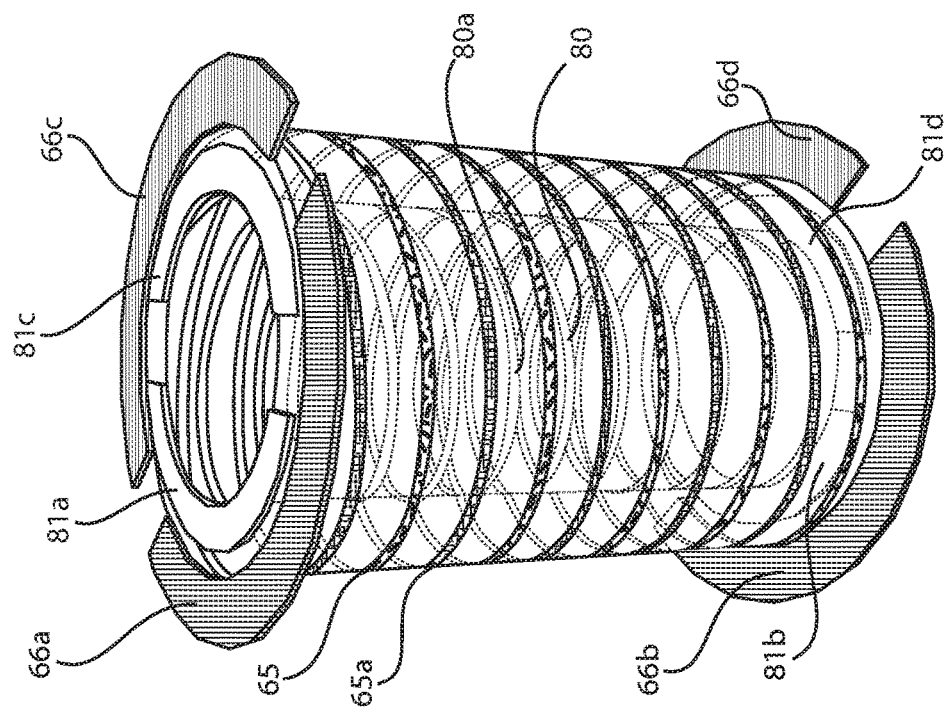
FIG. 15 is a side cross-sectional view of another embodiment of two spiral structures which were etched 180 degrees from each other's starting point, in which by combining these spirals within a single via local antennas may be formed within a printed circuit board.

FIG. 15 depicts another embodiment of two spiral structures which were etched 180 degrees from each other's starting point, in which by combining these spirals within a single via local antennas may be formed within a printed circuit board. The structure depicted in FIG. 15 may be formed using the method described with reference to FIG. 13. In the embodiment depicted in FIG. 15, the outer spiral 65, 65a may be similar to the spiral structure 65, 65a that is depicted in FIG. 10. This structure is formed using the first exposure applied by the light pipe structure 40. The inner spiral structure 80, 80a may also be similar to the spiral structure 65, 65a that is depicted in FIG. 10. This structure is formed using the second exposure applied by the light pipe structure, as described with reference to FIG. 13. FIG. 15 is an X-ray view of two spirals etched 180 degrees from each other's starting point inside of larger same structure. This would allow the creation of transformers, chokes, and current sensing circuitry with in the PCBs via structure. By combining these spirals you can create small local antennas with in the PCB structure itself.

Any of the aforementioned coils structures depicted in FIGS. 13-15 may further include a tap net connection to the coil of an inductor, as depicted in FIG. 12.

It is noted that the passive electrical device that is formed within the via is not limited to being an inductor. For example, the passive electrical device may be a resistor structure similar to those depicted in FIGS. 16 and 17, or the passive electrical device may be a capacitor structure similar to that depicted in FIG. 18.

A "resistor" is a passive two-terminal electrical component that implements electrical resistance as a circuit element. In electronic circuits, resistors can be used to reduce current flow, adjust signal levels, to divide voltages, bias active elements, and terminate transmission lines.

Figure 16:
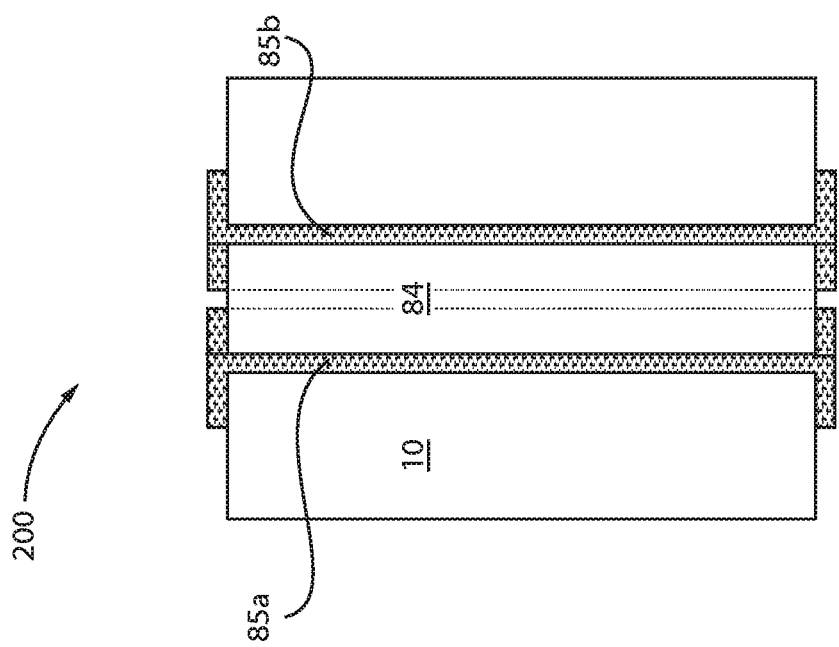
FIG. 16 is a side cross-sectional view of one embodiment of a resistor contained within a via that is formed with a process sequence employing a light pipe.

FIG. 16 depicts one embodiment of a resistor 200 contained within a via 20 that is formed with a process sequence employing a light pipe structure 40. Forming the resistor 200 may include patterning and etching the electrically conductive material layer 30 of the via structure depicted in FIG. 2 to provide two electrodes 85a, 85b and filling the remainder of the via with resistive element 84.

As depicted in FIG. 16, the electrodes 85a, 85b may be separated from one another and present on separate portions of a sidewall of the via, wherein at least one of the two electrically conductive electrodes extends along an entirety of the height of the via 20. The electrodes 85, 85b may be patterned by applying a photo reactive layer, e.g., photoresist layer, on the electrically conductive material layer 30; patterning the photo reactive layer with a light pipe structure masked to provide the electrode geometry (as depicted in FIG. 5); developing the exposed photo reactive layer to provide an etch mask that provides the electrode geometry; and etching the electrically conductive material layer 30 to provide the electrodes 85a, 85b, e.g., copper electrodes.

In some embodiments, following the formation of the electrodes 85a, 85b, the resistive element 84 is deposited filling the remainder of the via 20. Metals that can be used for the resistive element 84 can include platinum, nickel, copper, Balco (an iron-nickel alloy), tungsten, iridium and combinations thereof.

Figure 17:
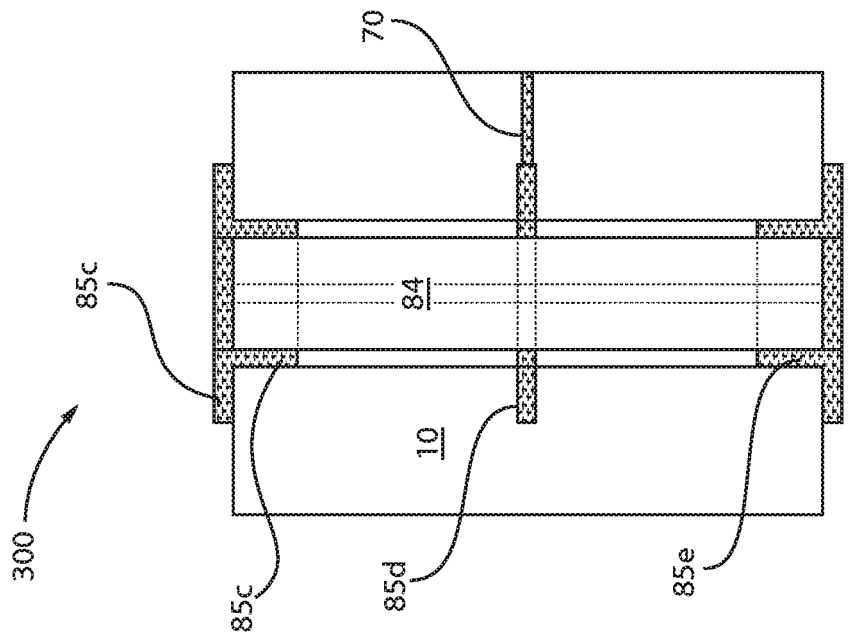
FIG. 17 is a side cross-sectional view of another embodiment of a resistor contained within a via that is formed with a process sequence employing a light pipe, in which the resistors structure includes a tap net connection.

FIG. 17 depicts another embodiment of a resistor 300 the is present within a via 20 of a printed circuit board (PCB) 10. In the resistor depicted in FIG. 17, a resistive element 84 is present filling a majority of the via 20. Differentiated from the embodiment of the resistor 200 that is depicted in FIG. 16, the electrodes 85c, 85e of the resistor 300 that is depicted in FIG. 17 do not extend along an entire height of the via 20. The resistor 300 also includes an electrode 85d that is centrally positioned in the via. The centrally positioned electrode 85d may be contacted by a tap net connection 70 to the coil of an inductor. The tap net connection 70 can be an embedded electrically conducive pathway, as a metal line and/or wire, that is present within the printed circuit board (PCB) 10. The resistor 300 that is depicted in FIG. 17 has a geometry that typically has a higher resistance than the geometry of the resistor 200 that is depicted in FIG. 16.

In some embodiments, the resistor 300 that is depicted in FIG. 17 may be configured to provides a memory device, such as a resistive random access memory device (RRAM or ReRAM (resistive RAM)). Resistive random access memory (RRAM or ReRAM), is a form of nonvolatile storage that operates by changing the resistance of a solid resistive material. An RRAM device contains a component called a memristor—a contraction of "memory resistor"— whose resistance varies when different voltages are imposed across it. The structure depicted in FIG. 17 may be processed to provide a resistive random access memory (RRAM or ReRAM).

Figure 18:
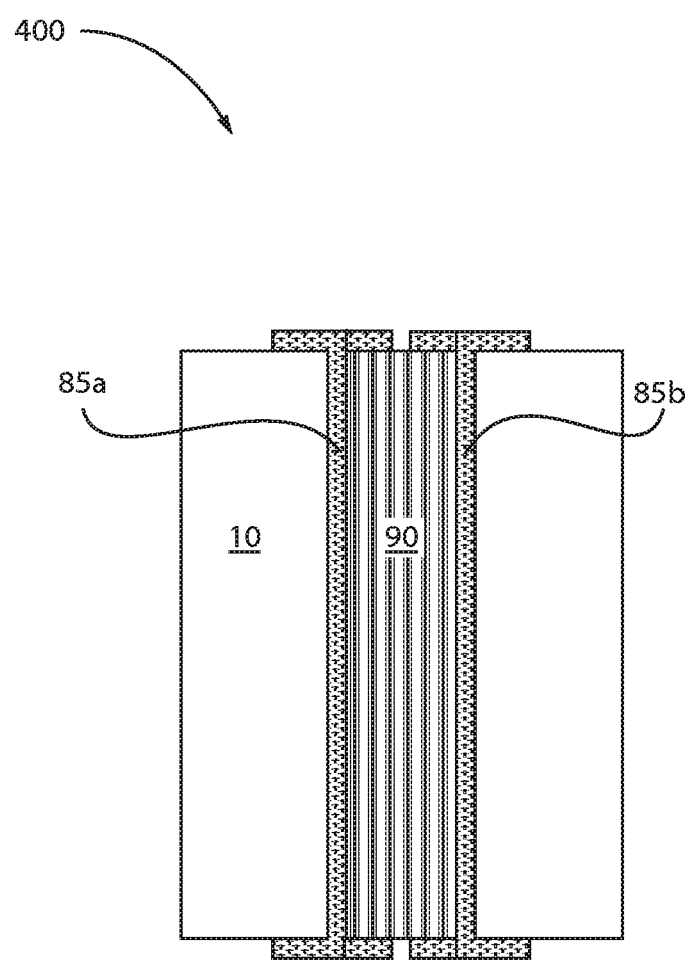
FIG. 18 is a side cross-sectional view of one embodiment of a capacitor contained within a via that is formed using a process sequence employing a light pipe.

FIG. 18 depicts another embodiment of the present disclosure, in which a capacitor 400 is contained within a via 20 that is formed using a process sequence employing a light pipe. A "capacitor" is a structure for storing a charge including two electrically conductive materials separated and insulated from each other by a dielectric. The term "electrode" as used to describe a component of the capacitor represents one of the two electrically conductive materials of the capacitor that are separated by the dielectric layer. A "node dielectric layer" is the dielectric layer that is present between the electrodes of the capacitor.

The electrodes 85a, 85b of the capacitor 400 are similar to the electrodes 85a, 85b of the resistor 200 that is depicted in FIG. 16. Therefore, the description of the electrodes 85a, 85b and their method of formation, which has been described with reference to FIG. 16 is suitable for describing the electrodes of the capacitor 400 that is depicted in FIG. 18.

The node dielectric 90 fills a remainder of the opening between two separate electrically conductive electrodes 85a, 85b to provide that said passive electronic device is a capacitor 400.

The node dielectric 90 may be composed of an oxide, such as silicon oxide ($SiO_2$), nitride, such as silicon nitride, a silicon oxynitride, or a combination thereof. In another example, the node dielectric 90 may be composed of a high-k dielectric material. The term "high-k" denotes a material having a dielectric constant that is greater than the dielectric constant of silicon oxide ($SiO_2$). For example, a high-k dielectric material typically has a dielectric constant that is greater than 4.0. In another example, a high-k dielectric material that may be employed for the node dielectric 90 has a dielectric constant that is greater than the 10. In yet another embodiment, the node dielectric 90 is comprised of a material having a dielectric constant ranging from 10 to 30. The dielectric constants mentioned herein are relative to a vacuum at room temperature, i.e., 20° C. to 25° C., at atmospheric pressure, i.e., 1 atm. Some examples of high-k dielectric materials suitable for the node dielectric 90 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the node dielectric 90 is hafnium oxide ($HfO_2$).

It is noted that the electrodes 85a, 85b of the capacitor 400 may be electrically contacted by a tap net connection similar to the tap net connection 70 that is depicted in FIG. 12. The tap net connection can be an embedded electrically conducive pathway, as a metal line and/or wire, that is present within the printed circuit board (PCB) 10 and provides for connection with an integrated circuit (IC) that is remotely positioned from the capacitor 400.

It is further noted, that the vias 20 are not limited to only one passive electrical device (or memory device in the case of a ReRAM/RRAM). Multiple of the aforementioned passive electrical devices may be position within a single via. For example, a resistor and an inductor may be present within one via, in which they are vertically stacked upon one another within the via 20. It is noted that this is only one example of a combination of passive electrical devices that may be positioned within the via 20. As noted, any of the passive electrical devices formed using the above example process including a light tube may be combined within a single via 20. Additionally, the combination of passive electrical devices within a single via is not limited to being only two passive devices, as described in the above combination. Any number of passive electrical devices that may fit within the depth of the via are suitable for being positioned within the via 20. For example, embodiments have been contemplated where three or four passive electrical devices can be positioned within the via 20, in which at least one of the passive electrical devices in the combination is formed using the light pipe employing methods that are described above.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for creating inductors, resistors, capacitors and other structures in printed circuit board vias with light pipe technology (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An inductor structure comprising:
 a via extending through a printed circuit board;
 at least one coil of an electrically conductive material beginning at a first opening to the via continuously present on a sidewall of the via encircling a center of the via extending to a second opening ci the via opposite the first opening of the via;
 a tap to center of a substantially center portion of a sidewall off, said at least one coil of the electrically conductive material, wherein the tap to center is present substantially encapsulated within the printed circuit board;
 a dielectric fill in the via;
 a ferromagnetic core present substantially centrally positioned in the at least one coil; and
 at least one electrode present in contact with an end of the coil at the first or second opening.

2. The inductor structure of claim 1, further comprising an opening present through the dielectric fill and a second coil present on sidewalls of the opening.

3. The inductor structure of claim 1, wherein the at least one comprises two concentric coils extending between the first and second opening of the via.

4. The inductor structure of claim 1, wherein the at least one electrode comprises a first contact formed on a first surface of the print d circuit board at the first opening and a second contact formed on a second sur ace of the printed circuit board at the second opening.

5. The inductor structure of claim 3, wherein each of the two concentric coils is in electrical communication with contacts formed at each of the first and second openings.

6. The inductor structure of claim 5, wherein at least two of the contacts are formed on opposite surfaces of the printed circuit board.

7. The inductor structure of claim 1, further comprising two contacts formed at each of the first and second openings of the via with each contact being in electrical communication with the electrically conductive material present on the sidewall of the via.

8. A passive electrical device comprising: a via extending through a printed circuit board; two electrically conductive electrodes that are separated from one another and present on separate portions of a sidewall of the via, wherein at least one of the two electrically conductive electrodes extends along an entirety of the height of the via; a dielectric fill in the via; a ferromagnetic core present substantially centrally positioned in the via; and a tap to center of a substantially center portion of a sidewall of at least one of the at least two electrically conductive electrodes that is present substantially encapsulated within the printed circuit board.

9. The passive electrical device of claim 8, wherein a resistive element is present as a core of the via in electrical communication with at least two electrically conductive electrodes to provide that the passive electrical device is a resistor.

10. The passive electrical device of claim 9, wherein the resistive element has a composition selected from the group consisting of platinum, nickel, copper, Balco (an iron-nickel alloy), tungsten, iridium and combinations thereof.

11. The passive electrical device of claim 8, wherein the dielectric fill is in electrical communication with at least two electrically conductive electrodes to provide that the passive electrical device is a capacitor.

* * * * *